(12) United States Patent
Menezes et al.

(10) Patent No.: US 10,332,599 B2
(45) Date of Patent: Jun. 25, 2019

(54) BIAS SCHEME FOR WORD PROGRAMMING IN NON-VOLATILE MEMORY AND INHIBIT DISTURB REDUCTION

(71) Applicant: Longitude Flash Memory Solutions Ltd, Dublin (IE)

(72) Inventors: Gary Menezes, San Jose, CA (US); Krishnaswamy Ramkumar, San Jose, CA (US); Ali Keshavarzi, Los Altos, CA (US); Venkatraman Prabhakar, Pleasanton, CA (US)

(73) Assignee: LONGITUDE FLASH MEMORY SOLUTIONS LTD., Dublin (IE)

( * ) Notice: Subject to any disclaimer, the term of this patent is extended or adjusted under 35 U.S.C. 154(b) by 0 days.

(21) Appl. No.: 15/918,704

(22) Filed: Mar. 12, 2018

(65) Prior Publication Data

US 2019/0147960 A1 May 16, 2019

Related U.S. Application Data

(60) Provisional application No. 62/591,048, filed on Nov. 27, 2017, provisional application No. 62/585,739, filed on Nov. 14, 2017.

(51) Int. Cl.
*G11C 16/10* (2006.01)
*G11C 16/04* (2006.01)
(Continued)

(52) U.S. Cl.
CPC ........ *G11C 16/107* (2013.01); *G11C 16/0466* (2013.01); *G11C 16/0483* (2013.01);
(Continued)

(58) Field of Classification Search
CPC .............. G11C 16/107; G11C 16/0466; G11C 16/0483; H01L 27/1157; H01L 29/1095;
(Continued)

(56) References Cited

U.S. PATENT DOCUMENTS

| 5,387,534 A | 2/1995 | Prall |
| 6,252,799 B1 * | 6/2001 | Liu ........................ G11C 16/04 257/E27.103 |

(Continued)

OTHER PUBLICATIONS

International Search Report for International Application PCT/US18/57799 dated Jan. 7, 2019, 2 pages.
(Continued)

*Primary Examiner* — Tri M Hoang
(74) *Attorney, Agent, or Firm* — Kunzler Bean & Adamson

(57) ABSTRACT

A memory device that includes a non-volatile memory (NVM) array, divided into a flash memory portion and an electrically erasable programmable read-only memory (EEPROM) portion. The NVM array includes charge-trapping memory cells arranged in rows and columns, in which each memory cell has a memory transistor including an angled lightly doped drain (LDD) implant, and a select transistor including a shared source region with a halo implant. The flash memory portion and the EEPROM portion are disposed within one single semiconductor die. Other embodiments are also disclosed.

20 Claims, 12 Drawing Sheets

(51) Int. Cl.
*H01L 29/167* (2006.01)
*H01L 29/36* (2006.01)
*H01L 29/78* (2006.01)
*H01L 29/51* (2006.01)
*H01L 29/08* (2006.01)
*H01L 27/11* (2006.01)
*H01L 27/1157* (2017.01)
*H01L 29/10* (2006.01)
*H01L 29/792* (2006.01)
*H01L 27/11524* (2017.01)
*H01L 29/788* (2006.01)

(52) U.S. Cl.
CPC ...... *H01L 27/1157* (2013.01); *H01L 29/0847* (2013.01); *H01L 29/1095* (2013.01); *H01L 29/167* (2013.01); *H01L 29/36* (2013.01); *H01L 29/513* (2013.01); *H01L 29/518* (2013.01); *H01L 29/7833* (2013.01); *H01L 29/7835* (2013.01); *H01L 29/7923* (2013.01); *G11C 16/0408* (2013.01); *H01L 27/11524* (2013.01); *H01L 29/7883* (2013.01)

(58) Field of Classification Search
CPC ..... H01L 29/167; H01L 29/36; H01L 29/513; H01L 29/518; H01L 29/7833; H01L 29/7835
See application file for complete search history.

(56) References Cited

U.S. PATENT DOCUMENTS

| | | | |
|---|---|---|---|
| 6,487,125 B2 | 11/2002 | Park et al. | |
| 6,831,863 B2* | 12/2004 | Yi | G11C 16/0466 257/E21.21 |
| 7,433,233 B2 | 10/2008 | Chen et al. | |
| 7,501,677 B2 | 3/2009 | Shiraiwa et al. | |
| 7,859,904 B1 | 12/2010 | Jenne et al. | |
| 8,289,775 B2 | 10/2012 | Lee et al. | |
| 8,542,541 B2* | 9/2013 | Hirose | G11C 5/145 365/185.29 |
| 8,861,273 B2* | 10/2014 | Lue | G11C 16/0433 365/185.17 |
| 8,958,248 B2* | 2/2015 | van Duuren | G11C 16/10 365/185.17 |
| 9,431,124 B2* | 8/2016 | Hirose | G11C 16/0466 |
| 9,747,987 B1 | 8/2017 | Prabhakar et al. | |
| 9,773,567 B1 | 9/2017 | Wang et al. | |
| 2007/0278557 A1 | 12/2007 | Chen et al. | |
| 2013/0294161 A1 | 11/2013 | Lee et al. | |
| 2016/0293256 A1 | 10/2016 | Hsu | |
| 2016/0307637 A1 | 10/2016 | Hsu | |

OTHER PUBLICATIONS

Written Opinion of the International Searching Authority for International Application No. PCT/US18/57799 dated Jan. 7, 2019, 6 pages.

Peter Forstner, MSP430 Flash Memory Characteristics, Texas Instruments, Sep. 2006—Revised Apr. 2008; 9 pages.

Suk-Kang Sung, et al., Fully Integrated SONOS Flash Memory Cell Array With BT (Body Tied)-FinFet Structure, IEEE Transactions on Nanotechnology, vol. 5, No. 3, May 2006; 6 pages.

Yong Kyu Lee, et al., Multilevel Verticle-Channel SONOS Nonvolatile Memory on SOI, IEEE Electron Device Letters, vol. 23, No. 11, Nov. 2002; 3 pages.

* cited by examiner

BIAS SCHEME FOR WORD PROGRAMMING IN NON-VOLATILE MEMORY AND INHIBIT DISTURB REDUCTION

CROSS-REFERENCE TO RELATED APPLICATIONS

The present application claims the priority and benefit under 35 U.S.C. § 119(e) of U.S. Provisional Application No. 62/585,739, filed on Nov. 14, 2017, and U.S. Provisional Application No. 62/591,048, filed on Nov. 27, 2017, which are both incorporated by reference herein in each of its entirety.

TECHNICAL FIELD

The present disclosure relates generally to non-volatile memory devices, and more particularly to biasing scheme for word/byte programming and methods to reduce inhibit disturb.

BACKGROUND

Non-volatile memories are widely used for storing data in computer systems, and typically include a memory array with a large number of memory cells arranged in rows and columns. In some embodiments, each of the memory cells may include at least a non-volatile element, such as charge trapping field-effect transistor (FET), floating gate transistor, that is programmed or erased by applying a voltage of the proper polarity, magnitude and duration between a control/memory gate and the substrate. For example, in a charge trapping FET, a positive gate-to-substrate voltage causes electrons to tunnel from the channel to a charge-trapping dielectric layer raising a threshold voltage ($V_T$) of the transistor, and a negative gate-to-channel voltage causes holes to tunnel from the channel to the charge-trapping dielectric layer lowering the threshold voltage.

Some contemporary system-on-chip integrated circuits (SOC ICs), such as micro-controllers, touch screen controllers, and smart cards have a significant amount of embedded non-volatile memory (NVM) in the form of flash and/or electrically erasable programmable read-only memory (EEPROM). Flash may be preferred in storing of data that is less frequently updated, such as for code and large data structure storage, while EEPROM may be more suitable for smaller, more frequently updated data structures. In some embodiments, charge-trapping memory technology, such as silicon-oxide-nitride-oxide-silicon (SONOS), is a fitting option for embedded NVM due to its low cost and simplicity of integration into complementary metal-oxide-silicon (CMOS) flows. SONOS has typically been adopted in a flash solution where a page (or row) may be the smallest block that is written to at a time. EEPROM operation, on the other hand, requires the capability to write to a smaller block (byte or word) at a time, and may adopt the floating gate memory technology. Due to their differences in structures and fabrication processes, flash memory (e.g. SONOS transistors) and EEPROM (e.g. floating gate transistors) memory may be disposed in separate portions on a single IC package or semiconductor die, or even in separate IC packages or dies in a system, and being operated individually.

There are demands to use one NVM technology, such as SONOS, for both flash and EEPROM schemes. The combined memory array may enable byte and word programming capabilities where a single page may be programmed up to 32 times or more. Moreover, the combined array removes the need for a separate EEPROM area on an embedded system, such as SOC. Programming a single SONOS page multiple times without erasing may cause memory bits to experience elevated levels of inhibit disturb.

It is, therefore, an object of the present invention to provide an optimized SONOS stack, doping scheme, and biasing conditions to reduce the inhibit disturb seen by these bits to the level that enables reliable word programming operation.

BRIEF DESCRIPTION OF THE DRAWINGS

The present invention will be understood more fully from the detailed description that follows and from the accompanying drawings and the appended claims provided below, where:

DETAILED DESCRIPTION

Figure 1A:
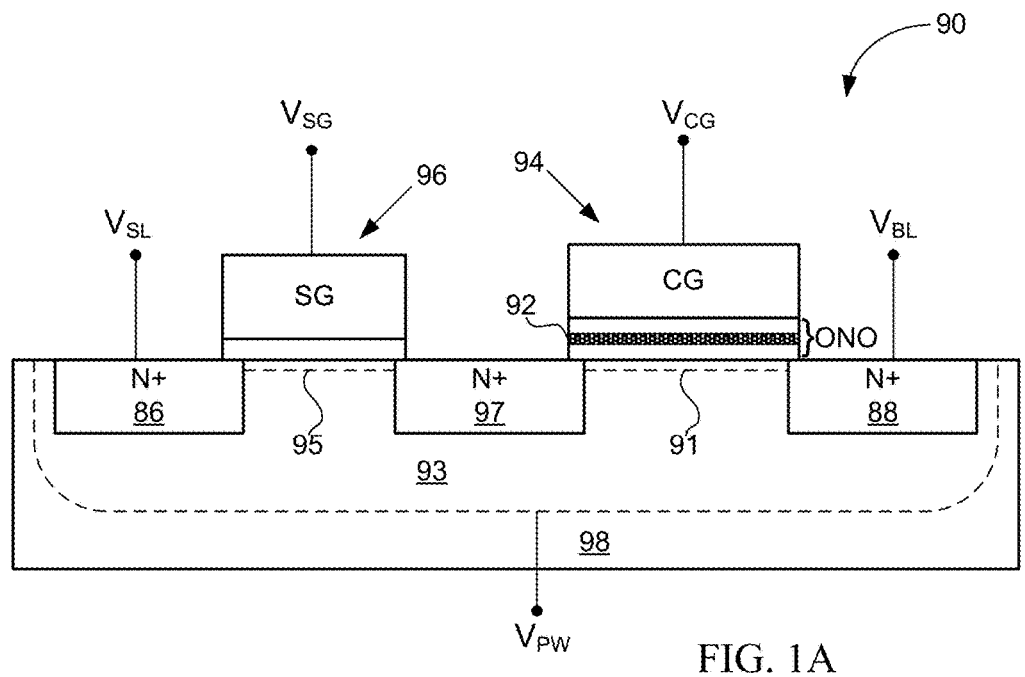
FIG. 1A is a block diagram illustrating a cross-sectional side view of a non-volatile memory transistor or device.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

SUMMARY OF SUBJECT MATTER

According to one embodiment of a memory device, the memory device includes a non-volatile memory (NVM) array, divided into a flash memory portion and an electrically erasable programmable read-only memory (EEPROM) portion. The NVM array includes charge-trapping memory cells arranged in rows and columns, in which each memory cell includes, a memory transistor including an angled lightly doped drain (LDD) implant in source and drain regions. The angled LDD implants extend at least partly under an oxide-nitride-oxide (ONO) stack of the memory transistor, and a select transistor including a shared source region with a halo implant. The shared source region may be shared between two adjacent memory cells of a same row of the NVM array. In one embodiment, the flash memory portion and the EEPROM portion may be disposed within one single semiconductor die.

In one embodiment, the memory cells of the NVM array may have a two-transistor (2T) architecture.

In one embodiment, the memory transistors are silicon-oxide-nitride-oxide-silicon (SONOS) based, each including a charge-trapping oxynitride layer.

In one embodiment, the charge-trapping oxynitride layer of the memory transistor has silicon content in an approximate range of 40-60% and oxygen content in an approximate range of 10-40%.

In one embodiment, the halo implant may surround at least partly the shared source region of the two adjacent memory cells. The select transistor may be an asymmetric transistor, in which the drain region of the select transistor may not have a halo implant.

In one embodiment, the angled LDD implants of the memory transistor comprise dopant dose in an approximate range of 1e12-1e14 atoms per $cm^2$.

In one embodiment, the memory cells may be n-type transistors, and disposed at least partly within a p-type well. The p-type well may have dopant dose in an approximate range of 1e12-1e14 atoms per $cm^2$.

In one embodiment, the p-type well may be doped with boron atoms around a junction with the source region of the memory transistor for a graded junction.

In one embodiment, the shared source region of the select transistor may have a first LDD, wherein the first LDD and the halo implant are implanted with dopants of opposite types.

In one embodiment, the EEPROM portion of the memory device is configured to perform word programming, in which multiple words may be written to one selected row of the NVM array sequentially using multiple program operations, and no erase operation is performed between each of the multiple program operations.

According one embodiment of the subject matter, a memory array may have an electrically erasable programmable read-only memory (EEPROM) portion, comprising memory cells arranged in rows and columns. In the EEPROM portion, each memory cell includes a charge-trapping non-volatile memory (NVM) transistor, memory cells in a same row share a SONOS word line, memory cells in a same column share a bit line, and memory cells in two adjacent columns couple to a common source line. During word programming of a selected row of the EEPROM portion, multiple words are written to memory cells of the selected row sequentially using multiple program operations. No erase operation may be performed between each of the multiple program operations. During programming of a first word to a first portion of the selected row, a positive voltage is applied to a SONOS word line associated with the selected row, a high inhibit voltage in an approximate range of 1.5 V-2.5 V may be applied to bit lines associated with memory cells of the first portion wherein an erased state is to be written, and the high inhibit voltage is further applied to bit lines associated with memory cells in portions of the selected row other than the first portion.

During programming of a second word to a second portion of the selected row, the high inhibit voltage may be applied to bit lines associated with memory cells of the second portion wherein the erased state is to be written, and memory cells in portions of the selected row other than the first and second portions.

In one embodiment, the first and second portions do not overlap.

In one embodiment, the memory array may also include a flash memory portion. The flash memory portion and the EEPROM portion may be disposed within one single semiconductor die.

In one embodiment, each of the memory cells of the EEPROM portion further includes an asymmetric select transistor, and the source of the asymmetric select transistor may have a halo implant.

According one embodiment of an embedded system of the subject matter, it includes a non-volatile memory (NVM) array divided into a flash portion and an EEPROM portion, in which each of the flash and EEPROM portions include charge-trapping memory cells arranged in rows and columns. Each memory cell may include a silicon-oxide-nitride-oxide-silicon (SONOS) based memory transistor including an angled lightly doped drain (LDD) implant in its source and drain regions. The drain region may be coupled to a bit line and a control gate to a SONOS word line. The memory cell may further include a select transistor including a shared source region with a halo implant, in which the shared source region may be shared between two adjacent memory cells of a same row of the NVM array. The embedded system may also have a programmable control circuitry coupled to the EEPROM portion. The programmable control circuitry is configured to provide operating voltages to enable word programming of one selected row of the EEPROM portion.

In one embodiment, the angled LDD implants of the memory transistor may have dopant dose in an approximate range of 1e12-1e14 atoms per cm$^2$.

In one embodiment, the word programming includes writing multiple words sequentially to the selected row using multiple program operations. No erase operation is performed between each of the multiple program operations.

In one embodiment, the operating voltages may include a first high voltage provided to a SONOS word line associated with memory cells of the selected row and a second high voltage provided to bit lines associated with memory cells to be inhibited. The second high voltage is an inhibit voltage in an approximate range of 1.5 V-2.5 V to reduce inhibit disturb.

Figure 1B:
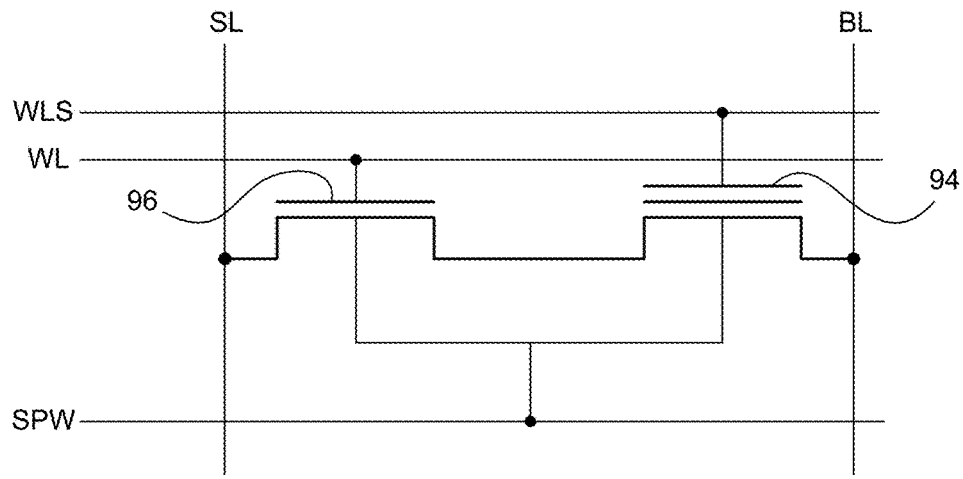
FIG. 1B illustrates a corresponding schematic diagram of the non-volatile memory transistor or device depicted in FIG. 1A.

FIG. 1A is a block diagram illustrating a cross-sectional side view of a non-volatile memory cell, and its corresponding schematic diagram is depicted in FIG. 1B. A non-volatile memory (NVM) array or device may include NVM cells with a non-volatile memory transistor or device implemented using Silicon-Oxide-Nitride-Oxide-Silicon (SONOS) or floating gate technology, and a regular field-effect transistor (FET) disposed adjacent or couple to one another.

In one embodiment, illustrated in FIG. 1A, the non-volatile memory transistor is a SONOS-type charge trapping non-volatile memory transistor. Referring to FIG. 1A, NVM cell 90 includes a control gate (CG) or memory gate (MG) stack of NV transistor 94 formed over substrate 98. NVM cell 90 further includes source 97/drain 88 regions formed in substrate 98, or optionally within well 93 in substrate 98, on either side of NV transistor 94. In one embodiment, source/drain regions are connected by channel region 91 underneath NV transistor 94. NV transistor 94 includes an oxide tunnel dielectric layer, a nitride or oxynitride charge-trapping layer 92, an oxide top or blocking layer, forming the ONO stack. A poly-silicon (poly) or metal layer disposed overlying the ONO layer, which may serve as a control gate (CG) or memory gate (MG). As best shown in FIG. 1A, NVM cell 90 further includes a FET 96 disposed adjacent to NV transistor 94. In one embodiment, FET 96 includes a metal or poly select gate (SG) disposed overlying an oxide gate dielectric layer. FET 96 further includes source/drain regions formed in substrate 98, or optionally within well 93 in substrate 98, on either side of FET 96. As best shown in FIG. 1A, FET 96 and NV transistor 94 share source/drain region 97 disposed in between, or referred to as internal node 97. SG is appropriately biased $V_{SG}$ to open or close the channel 95 underneath FET 96. NVM cell 90, as illustrated in FIG. 1A, is considered having a two-transistor (2T) architecture, wherein NV transistor 94 and FET 96 may be considered the memory transistor and the select or pass transistor, respectively throughout this patent document.

In one embodiment, FIG. 1B depicts a two-transistor (2T) SONOS NVM cell 90 with non-volatile (NV) transistor 94 connected in series with FET 96. NVM cell 90 is programmed (bit value "1") when CG is appropriately biased $V_{CG}$, or by applying a positive pulse on CG with respect to substrate 98 or well 93 that causes electrons to be injected from the inversion layer into charge-trapping layer 92 by Fowler-Nordheim Tunneling (FNT). The charge trapped in the charge-trapping layer 92 results in an energy barrier between the drain 88 and the source 97, raising the threshold voltage ($V_T$) necessary to turn on the SONOS based NV transistor 94, putting the device in a "programmed" state. NVM cell 90 is erased by applying an opposite bias $V_{CG}$ on the CG, or a negative pulse on CG, with respect to substrate 98 or well 93 causing FNT of holes from the accumulated channel 91 into the ONO stack. Programmed and erased threshold voltages are called "Vtp" and "Vte" respectively. In one embodiment, NV transistor 94 may also be in an inhibit state (bit value "0") wherein a previously erased cell (bit value "0") is inhibited from being programmed (bit value "1") by applying a positive voltage on the source and drain of NVM cell 90 while control gate (CG) is pulsed positive with respect to substrate 98 or well 93 (as in the program condition). The threshold voltage (referred to as "Vtpi") of NV transistor 94 becomes slightly more positive due to the disturbing vertical field but it remains erased (or inhibited). In one embodiment, Vtpi is also determined by the ability of the charge-trapping layer 92 of the ONO stack to keep the trapped charges (holes for the erased state) in charge-trapping layer 92. If the charge traps are shallow, the trapped charges tend to dissipate and the Vtpi of NV transistor 94 becomes more positive. In one embodiment, Vtpi of NV transistor 94 tends to decay or creep up with further inhibit operations. It will be the understanding that the allocation of bit or binary values "1" and "0" to the respective "programmed" and "erased" states of NVM cell 90 herein is only for explanation purposes, and not to be interpreted as a limitation. The allocation may be reversed or have other arrangements in other embodiments.

In another embodiment, the NV transistor 94 may be a floating-gate MOS field-effect transistor (FGMOS) or device. Generally, FGMOS is similar in structure to the SONOS based NV transistor 94 described above, differing primarily in that a FGMOS includes a poly-silicon (poly) floating gate, which is capacitively coupled to inputs of the device, rather than a nitride or oxynitride charge-trapping layer 92. Thus, the FGMOS device can be described with reference to FIGS. 1A and 1B, and operated in a similar manner.

Similar to the SONOS based NV transistor 94, the FGMOS device may be programmed by applying an appropriate bias $V_{CG}$ between the control gate and the source and drain regions, raising the threshold voltage $V_T$ necessary to turn on the FGMOS device. The FGMOS device can be erased by applying an opposite bias $V_{CG}$ on the control gate.

In one embodiment, source/drain region 86 may be considered as the "source" of NVM cell 90, and coupled to $V_{SL}$, while source/drain region 88 as the "drain", and coupled to $V_{BL}$. Optionally, well 93 is coupled with $V_{PW}$. As best shown in FIG. 1A, both FET 96 and NV transistor 94 may be n-type or n-channel transistors, wherein source/drain regions 86, 88, 97 are doped with n-type material while well 93 and/or substrate 98 is doped with p-type material. It will be the understanding that NVM cell 90 may also include, additionally or alternatively, p-type or p-channel transistors, wherein the source/drain regions and well may be doped oppositely, or differently according to the practice of ordinary skill in the art.

A memory array is constructed by fabricating a grid of memory cells, such as NVM cells 90, arranged in rows and columns and connected by a number of horizontal and vertical control lines to peripheral circuitry such as address decoders and sense amplifiers. Each memory cell includes at least one non-volatile semiconductor device, such as those described above, and may have a one-transistor (1T), or two-transistor (2T) architecture as described in FIG. 1A.

Figure 2:
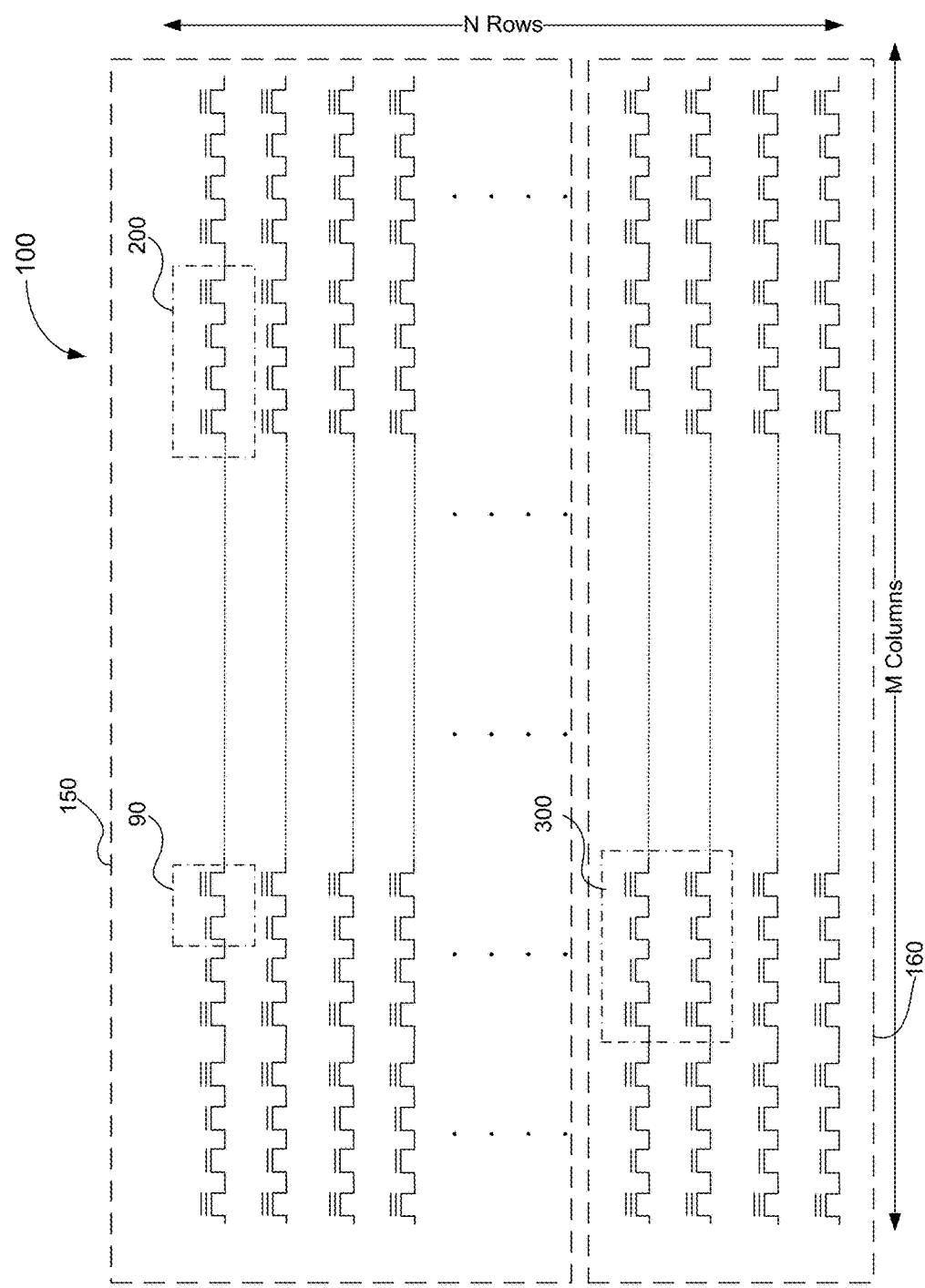
FIG. 2 is a schematic diagram illustrating a non-volatile memory array according to one embodiment of the present disclosure.

FIG. 2 is a schematic diagram illustrating an NVM array in accordance with one embodiment of the subject matter. In one embodiment, illustrated in FIG. 2, the memory cell 90 has a 2T architecture and includes, in addition to a non-volatile memory transistor, a pass or select transistor, for example, a conventional IGFET sharing a common substrate connection, or internal node, with the memory transistor. In one embodiment, NVM array 100 includes NVM cells 90 arranged in N rows or page (horizontal) and M columns (vertical). NVM cells 90 in the same row may be considered to be in the same page. In some embodiments, several rows or pages may be grouped together to form memory sectors. It should be appreciated that the terms "rows" and "columns" of a memory array are used for purposes of illustration, rather than limitation. In one embodiment, rows are arranged horizontally and columns are arranged vertically. In another embodiment, the terms of rows and columns of memory array may be reversed or used in an opposite sense, or arranged in any orientation.

Figure 3A:
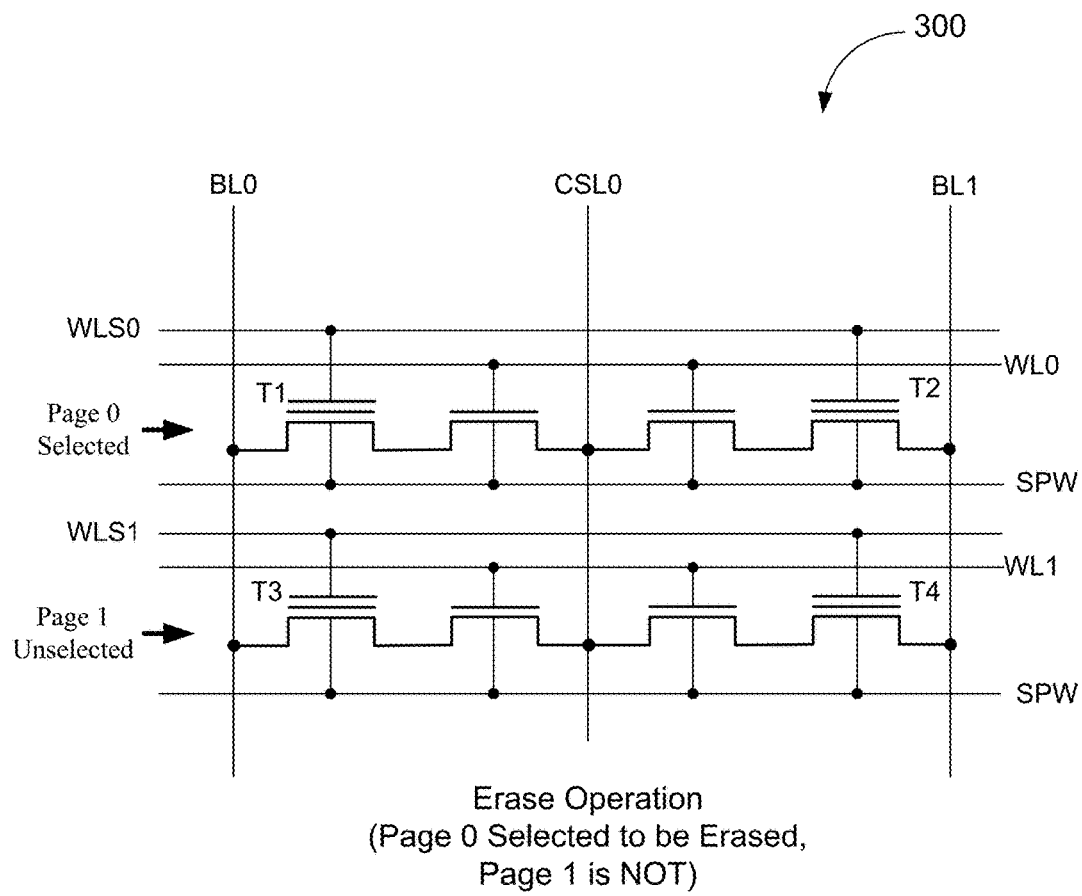
FIG. 3A is a schematic diagram of a segment of a non-volatile memory array illustrating an embodiment of an erase operation according to the present disclosure.

In one embodiment, a SONOS word line (WLS) is coupled to all CGs of NVM cells 90 of the same row, a word line (WL) is coupled to all SGs of NVM cells 90 of the same row. A bit lines (BL) are coupled to all drain regions 88 of NVM cells 90 of the same column, while a common source line (CSL) or region 86 is coupled or shared among all NVM cells in the array, in one embodiment. In one alternative embodiment, a CSL may be shared between two paired NVM cells, such as T1 and T2 as best shown in FIG. 3A, of the same row. An CSL also couples to shared source regions of all NVM pairs of the same two columns.

In the flash mode, a write operation may consist of a bulk erase operation on a selected row (page) followed by program or inhibit operations on individual cells in the same row. The smallest block of NVM cells that can be erased at a time is a single page (row). The smallest block of cells that can be programmed/inhibited at a time may also be a single page.

Figure 9:
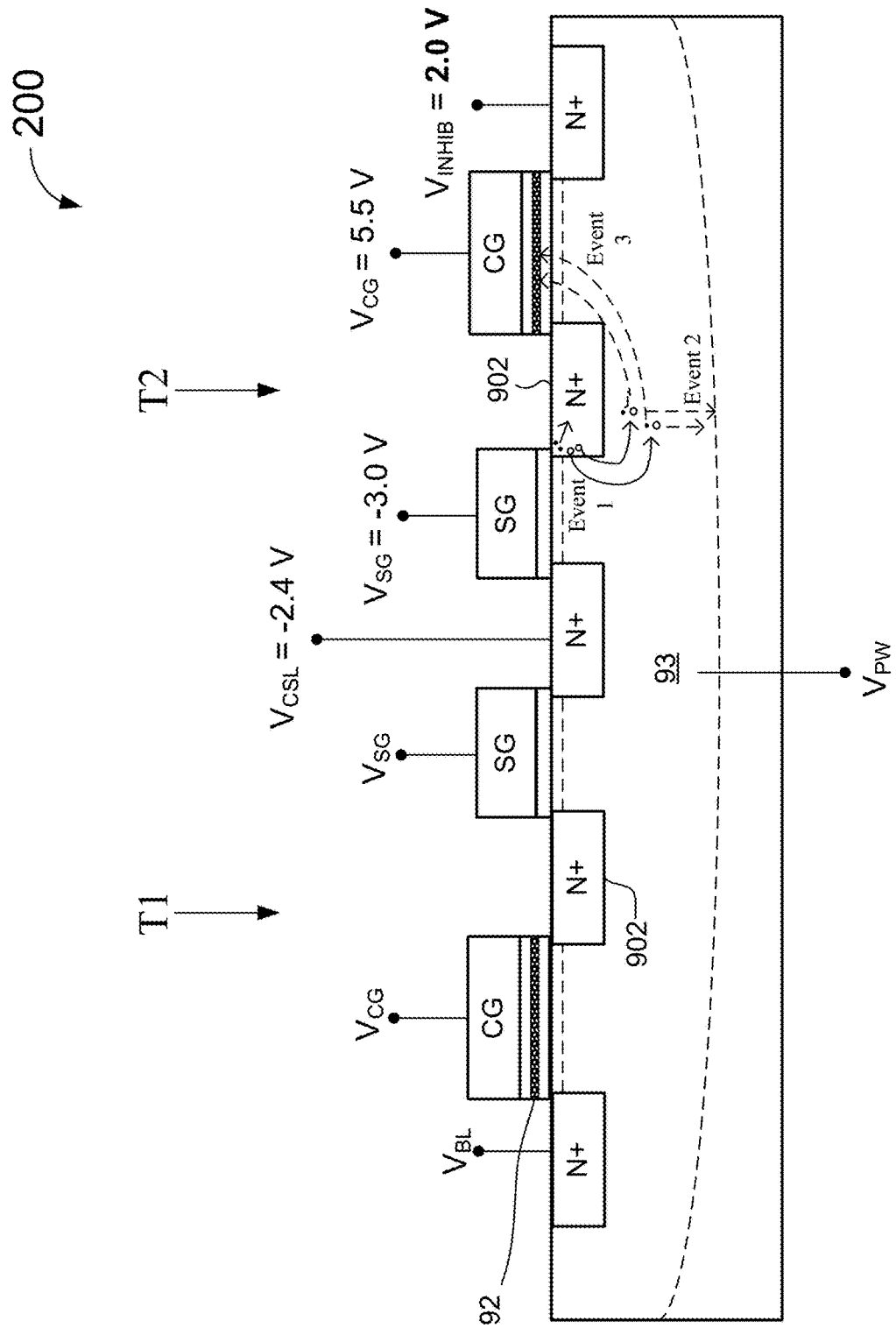
FIG. 9 is a block diagram illustrating a cross-sectional side view of one embodiment of a non-volatile memory transistor pair in a non-volatile memory array according to an embodiment of the present disclosure.

Referring to FIG. 2, NVM cells 90 may be arranged in pairs, such as NVM cell pair 200. In one embodiment, as best shown in FIG. 9, NVM cell pair 200 includes two NVM cells 90 having a mirrored orientation, such that select transistors of each NVM cell 90 is disposed adjacent to one another. NVM cells 90 of the same NVM cell pair 200 may also share a common source region, receiving the voltage signal $V_{CSL}$.

FIG. 3A illustrates a 2×2 array 300 of NVM array 100 to demonstrate an embodiment of an erase operation according to the present disclosure. As explained earlier, NVM array 100 may adopt a common source-line (CSL) configuration. In one embodiment, one single CSL (e.g. CSL0) is shared among all NVM cells in the NVM array or at least between NVM cells (e.g. T1 and T2) of adjoining columns. In one embodiment, CSLs may be disposed and shared between select transistors of NVM cells 90 of adjacent columns. In the following description, for clarity and ease of explanation, it is assumed that all of the transistors in NVM array 100 including 2×2 array 300 are N-type transistors. It should be appreciated, without loss of generality that a P-type configuration can be described by reversing the polarity of the applied voltages, and that such a configuration is within the contemplated embodiments of the disclosure. In addition, the voltages used in the following description are selected for ease of explanation and represent only one exemplary embodiment of the subject matter. Other voltages may be employed in different embodiments.

FIG. 3A illustrates an exemplary embodiment of a segment of a NVM array 100, which may be part of a large memory array of memory cells. In FIG. 3A, 2×2 memory array 300 includes at least four memory cells T1, T2, T3, and T4 arranged in two rows and two columns. While NVM cells T1-T4 may be disposed in two adjacent columns (common source line CSL0), they may be disposed in two adjacent rows, or two non-adjacent rows. Each of the NVM cells T1-T4 may be structurally similar to NVM cell 90 as described above.

Each of NVM cells T1-T4 may include a SONOS based memory transistor and a select transistor. Each of the memory transistors includes a drain coupled to a bit line (e.g. BL0 and BL1), a source coupled to a drain of the select transistor and, through the select transistor, to a single, common source line (e.g. CSL0). Each memory transistor further includes a control gate coupled to a SONOS word line (e.g. WLS0). The select transistors each includes a source coupled to the common source line (e.g. CSL0) and a select gate coupled to a word line (e.g. WL0).

Referring to FIG. 3A, for example, page 0 is selected to be erased and page 1 is not (unselected) for an erase operation. As explained earlier, a single page may be the smallest block of NVM cells 90 that is erased in one operation. Therefore, all NVM cells including T1 and T2 in a selected row (page 0) are erased at once by applying the appropriate voltages to a SONOS word line (WLS0) shared by all NVM cells in the row, the substrate connection and to all bit lines in NVM array 100. In one embodiment, a negative voltage $V_{NEG}$ is applied to WLS0, and a positive voltage $V_{POS}$ is applied to substrate or p-well via SPW of all NVM cells in page 0, all bit lines including BL0 and BL1, and the common source lines including CSL. Therefore, a full erase voltage ($V_{NEG}$-$V_{POS}$) is impressed between CGs and substrate/P-wells of memory transistors in T1 and T2 to erase any previously trapped charge (if any) therein. In one embodiment, all word lines including WL0 and WL1 are coupled to a supply voltage $V_{PWR}$.

Still referring to FIG. 3A, when a page (row) is not selected for an erase operation, e.g. page 1, a positive voltage $V_{POS}$ is applied to WLS1 instead, such that the CGs to substrate/P-wells of memory transistors in page 1 include T3 and T4 is approximately 0 V ($V_{POS}$-$V_{POS}$). Therefore, the state of NVM cells of page 1 remain unchanged (not erased).

Table I depicts exemplary bias voltages that may be used for a bulk erase operation of page 0 of a non-volatile memory having a 2T-architecture and including memory cells with N-type SONOS transistors and CSLs, resembling 2×2 array 300.

TABLE I

| WLS0 | BL0 | WL0 | SPW | CSL0 | WLS1 | BL1 | WL1 |
|---|---|---|---|---|---|---|---|
| $V_{NEG}$ e.g. −3.0 V | $V_{POS}$ e.g. +5.5 V | $V_{PWR}$ | $V_{POS}$ e.g. +5.5 V | $V_{POS}$ e.g. +5.5 V | $V_{POS}$ e.g. +5.5 V | $V_{POS}$ e.g. +5.5 V | $V_{PWR}$ |

Figure 3B:
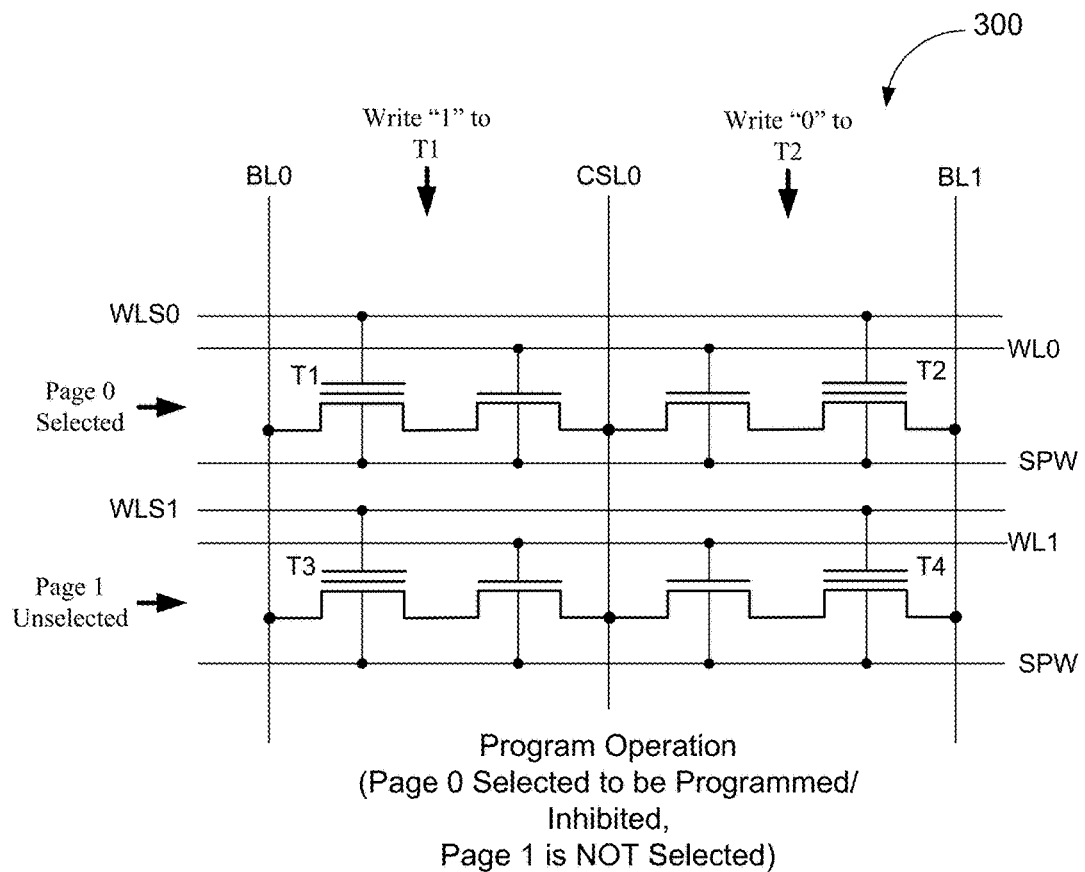
FIG. 3B is a schematic diagram of a segment of a non-volatile memory array illustrating an embodiment of a program operation according to the present disclosure.

FIG. 3B illustrates an exemplary embodiment of a segment 2×2 array 300 of NVM array 100, during a program operation. Referring to FIG. 3B, for example, NVM cell T1 is the targeted cell to be programmed or written to a logic "1" state (i.e., programmed to an OFF state) while NVM cell T2, already erased to a logic "0" state by a preceding erase operation as depicted in FIG. 3A, is maintained in a logic "0" or ON state. It will be the understanding that T1 and T2, while being illustrated as two adjacent cells for illustrative purposes, may also be two separated NVM cells on the same row, such as row 0. These two objectives (programming T1 and inhibiting T2) are accomplished by applying a first or positive high voltage ($V_{POS}$) to WLS0 in page or row 0 of NVM array 100, a second or negative high voltage ($V_{NEG}$), is applied to BL0 to bias memory transistor of T1 on programming the selected memory cell, while an inhibit voltage ($V_{INHIB}$) is applied to BL1 to bias memory transistor of T2 on inhibiting programming of the unselected memory cell, and a common voltage is applied to the shared substrate or p-well SPW of all NVM cells, and the word lines (WL1 and WL2) coupled to the second or negative high voltage ($V_{NEG}$). In one embodiment, the common source line CSL0 between T1 and T2 or among all NVM cells 90 may be at a third high voltage or CSL voltage ($V_{CSL}$), or allowed to float. In one embodiment, third high voltage $V_{CSL}$ may have a voltage level or absolute magnitude less than $V_{POS}$ or $V_{NEG}$. In one embodiment, $V_{CSL}$ may be generated by its own dedicated circuitry including DAC in the memory device (not shown). $V_{CSL}$ may have an approximately same voltage level or absolute magnitude as margin voltage $V_{MARG}$, which will be discussed in further detail in later sections. When $V_{POS}$ via WLS0 is applied to the memory transistor of T2, the positive $V_{INHIB}$ on BL1 is transferred to its channel. This voltage reduces the gate-to-drain/channel voltage on the memory transistor of T2, reducing the programming field so that the shift in threshold voltage from Vte is small. The tunneling of charges that may still occur is known as the inhibit disturb, and is quantified as (Vte-Vtpi). In one embodiment, as a result of the program operation, all NVM cells of page 0 including T1 and T2, may attain a binary state of "1" (programmed—Vtp) or "0" (inhibited—Vtpi) based on the bit line voltage the NVM cell receives. NVM cells in unselected pages, such as page 1, may remain the binary state of "0" (erased—Vte).

In addition, and as described in greater detail below, a selected margin voltage ($V_{MARG}$) having a voltage level or absolute magnitude less than $V_{NEG}$ is applied to WLS1 in an unselected row or page (e.g. page 1) to reduce or substantially eliminate program-state bit line disturb in the unselected NVM cell T4 due to programming of the selected T1. In one embodiment, the absolute voltage level or magnitude of $V_{MARG}$ may be the same as $V_{CSL}$.

Table II depicts exemplary bias voltages that may be used for programming a non-volatile memory having a 2T-architecture and including memory cells with N-type SONOS transistors and CSLs.

TABLE II

| WLS0 | BL0 | WL0 | SPW | CSL0 | WLS1 | BL1 | WL1 |
|---|---|---|---|---|---|---|---|
| $V_{POS}$ e.g. +5.5 V | $V_{NEG}$ e.g. −3.0 V | $V_{NEG}$ e.g. −3.0 V | $V_{NEG}$ e.g. −3.0 V | Float/ $V_{CSL}$ e.g. −2.4 V/ $V_{MARG}$ e.g. −2.6 V | $V_{MARG}$ e.g. −2.6 V | $V_{INHIB}$ e.g. +1.2 V | $V_{NEG}$ e.g. −3.0 V |

Generally, the margin voltage ($V_{MARG}$) has the same polarity as the second high voltage or $V_{NEG}$, but is higher or more positive than $V_{NEG}$ by a voltage equal to at least the threshold voltage ($V_T$) of the memory transistors for which program state bit line disturb is reduced.

Figure 4:
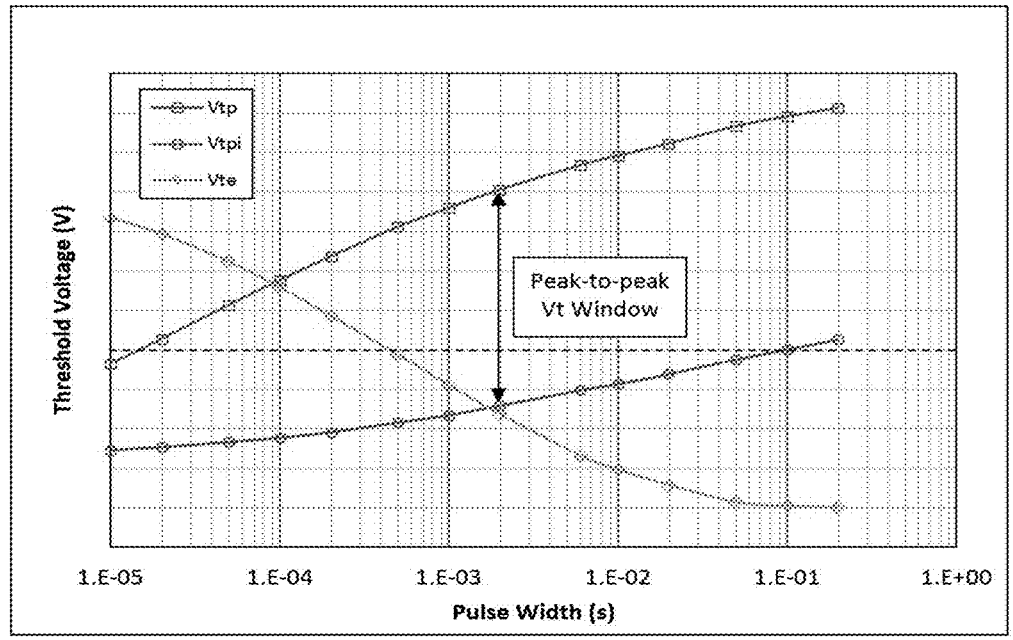
FIG. 4 is a graph illustrating the relationship of threshold voltages Vtp (programmed), Vte (erased), and Vtpi (inhibited) to program/erase pulse width of a memory transistor in a non-volatile memory array according to an embodiment of the present disclosure.

FIG. 4 depicts an embodiment of a set of pulse width curves for the SONOS based NVM cells. In one embodiment, the x-axis represents the duration of the pulse applied to the CG, and the y-axis depicts the mean $V_T$ level of several cells in either a programmed, erased, or inhibited state. Under regular flash operation, as an example, program pulse time (Tp)=2 ms, and erase pulse time (Te)=6 ms. To reliably distinguish between "0" and "1" states during a read operation, there should be enough separation between the Vtp and Vtpi levels. Vt window is defined as (Vtp-Vtpi).

Figure 5:
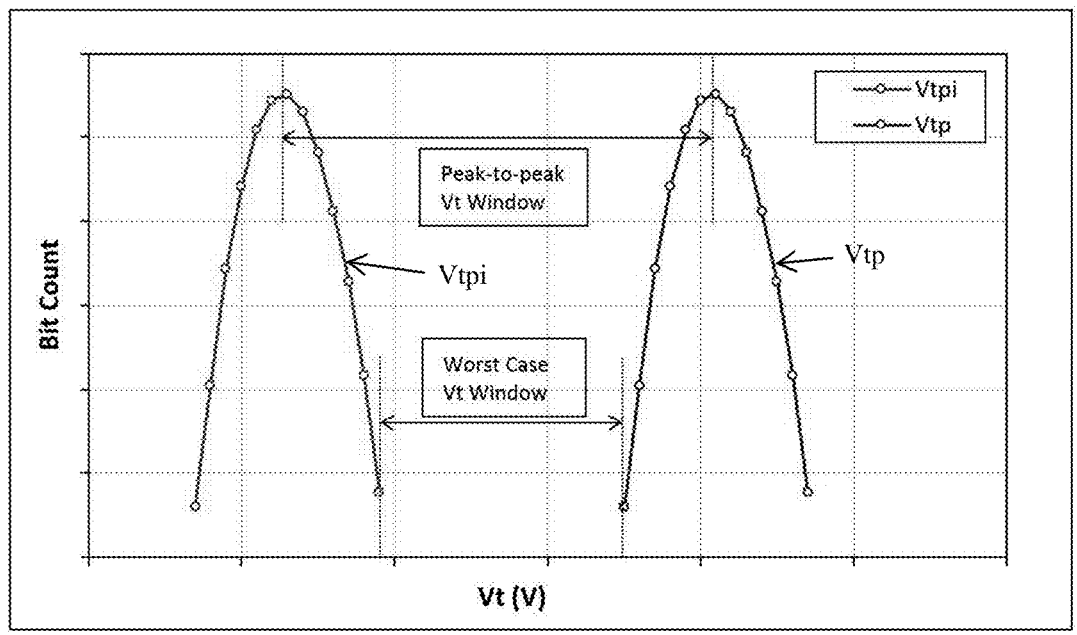
FIG. 5 is a graph illustrating distribution of threshold voltages Vtp and Vtpi of memory transistors in a non-volatile memory array according to an embodiment of the present disclosure.

FIG. 5 shows the Vtp & Vtpi distributions in an exemplary SONOS based NVM array, such as NVM array 100. The Vtp and Vtpi levels depicted in FIG. 4 would correspond to the peaks of these two distributions. The worst case Vt window determines if all the NVM cells in the array may be reliably read. Therefore, it is imperative to improve the worst case Vt window of the NVM array such that minimal number of NVM cells may be read incorrectly due to the close range of Vtp and Vtpi, especially after numerous write cycles.

Referring again to FIG. 2, in one embodiment, NVM array 100 may be further divided into flash array 150 and EEPROM array 160. NVM cells 90 in either flash array 150 and EEPROM array 160 may be SONOS based and structurally similar to the embodiment depicted in FIGS. 1 and 9. In one embodiment, flash array 150 and EEPROM array 160 may be disposed adjacent to one another within a single memory array, or a single integrated circuit package, and may be fabricated simultaneously due to the similarity in structural features. NVM array 100 may be configured that certain portion(s) (e.g. page 0-X) to be functioned as a flash memory device, and other portion(s) (e.g. page X+1-N−1) as an EEPROM device. The configuration may be achieved by connections to outside circuitry, and/or operation parameters including but not limited to voltage signals, signal duration, etc. It will be the understanding that there may be multiple portions of NVM array 100 configured to function as a flash memory or EEPROM device and those portions may or may not be physically adjacent to one another.

In a flash memory operation mode, as an example, assuming one page of NVM array 100 is 1024 bits (128 bytes) long (M=1024). To write a data structure smaller than 128 bytes to this page, e.g. page 0, the entire page is erased and then programmed. In one embodiment, if this particular data structure is required to be updated frequently, this one page may be subjected to a high number of write cycles. The high number of write cycles may adversely affect the performance of NVM cells of the page, such as the reduction of (Vtp-Vtpi) window as depicted in FIG. 5.

In one embodiment, instead of writing to the same page or page(s) frequently, a circular buffer is adopted by the flash memory, such as flash memory array 150. The data structure is written to a new page each time it is updated, and circling back to the first page when all available new pages have been written to. In one embodiment, for data structures that are relatively short compared to the page bit length, such as a few bytes/words long, and are updated frequently, unused bits in the pages may be driven into erase saturation.

In one embodiment, flash memory 150 may be used to store data structures that are less frequently updated, and/or longer in bit length (compared to the page bit length of flash memory 150). For data that is updated frequently and shorter in bit length as previously described, it may be stored in EEPROM memory array 160 instead.

Figure 6:
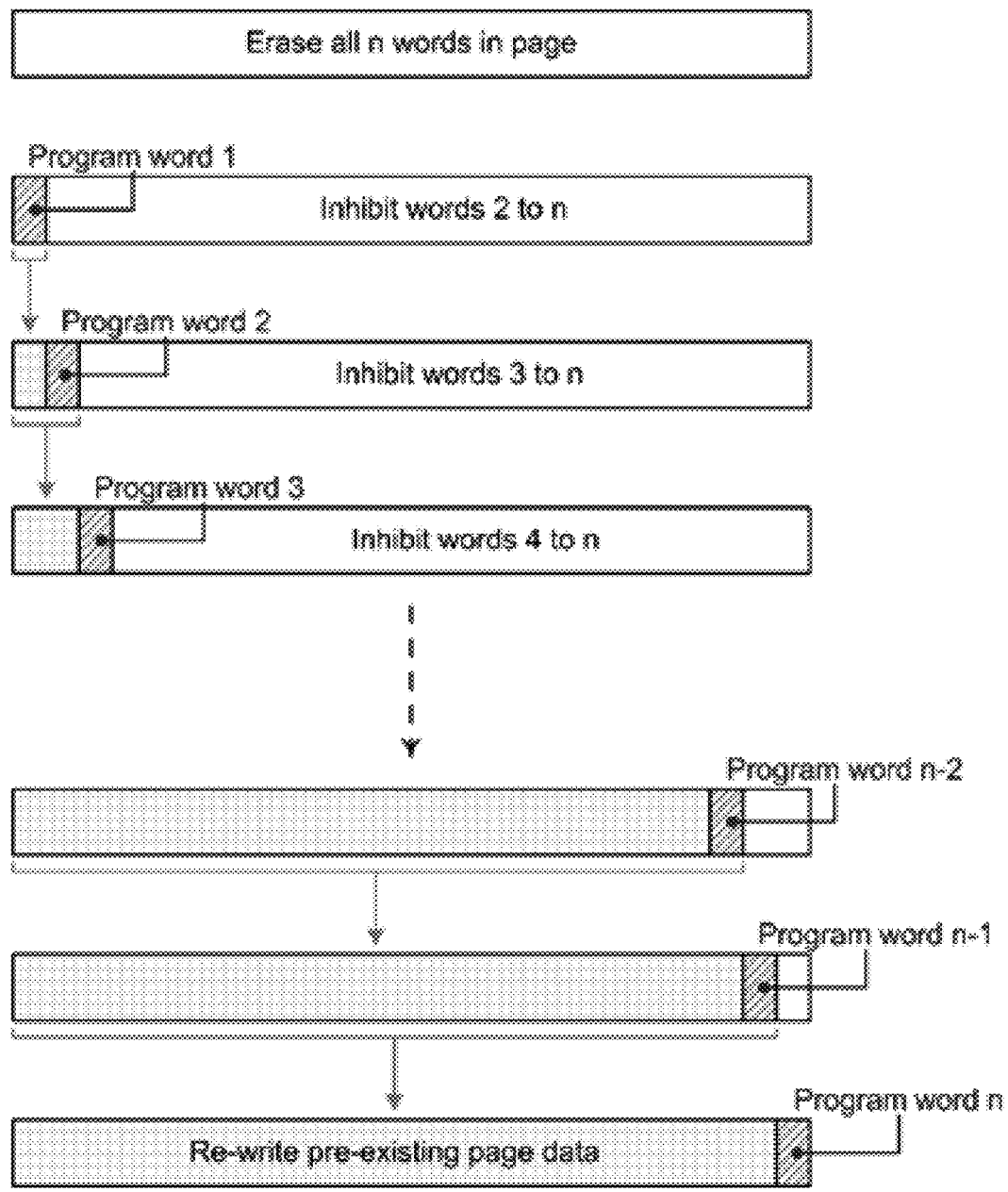
FIG. 6 is a block diagram illustrating a word/byte write cycle of a row or a page in a non-volatile memory array according to an embodiment of the present disclosure.

FIG. 6 illustrates a write cycle of a word/byte programming based EEPROM emulation on a page containing n words, such as EEPROM memory 160. In general, conventional EEPROM array is a floating gate based memory device. In one embodiment, as previously described, EEPROM array 160 is structurally similar to flash memory 150, as in SONOS based charge-trapping memory instead, and also depicted in FIGS. 1A and 1B.

In one embodiment, the operation may be extended to byte programming or multiple byte/word programming. Writing to the page begins with a page erase in EEPROM array 160, the operation may be similar to the embodiment depicted in FIG. 3A. Then, n words ($1^{st}$-$n^{th}$ word) are sequentially written to the same selected page. In one embodiment, each of the n words may have the same bit length or different bit lengths. Subsequent to the page bulk erase, the $1^{st}$ word or program word 1 is written to a first portion of the selected page. It will be the understanding that the first portion, and any subsequent portions of the selected page, may be physically disposed in any column(s) of the selected page (row), and not limited to the first few columns as illustrated in FIG. 6. In one embodiment, the operation is similar to the embodiment depicted in FIG. 3B, wherein binary state "1—programmed" or "0—inhibited" is written in memory transistors of each NVM cells within the first portion corresponding to the $1^{st}$ word. Concurrently, NVM cells in portions other than the first portion of the page are all inhibited to retain the binary state of "0". In one embodiment, there is no erase operation on the page between subsequent write operations. Subsequently, $2^{nd}$ word is being written to the second portion of the page in a similar manner, while NVM cells in portions other than the first and second portions are again inhibited. Concurrently, the first portion is re-programmed to retain its content. In general, while writing the $i^{th}$ word, the first to $(i-1)^{th}$ portions are re-programmed with previous data, and the $(i+1)^{th}$ to $n^{th}$ portions are again inhibited. In one alternative embodiment, the first to $(i-1)^{th}$ portions could be inhibited instead of being re-programmed for better endurance characteristics. The write cycle will continue until all n words are written into the selected page, or all NVM cells of the page are used.

Figure 7:
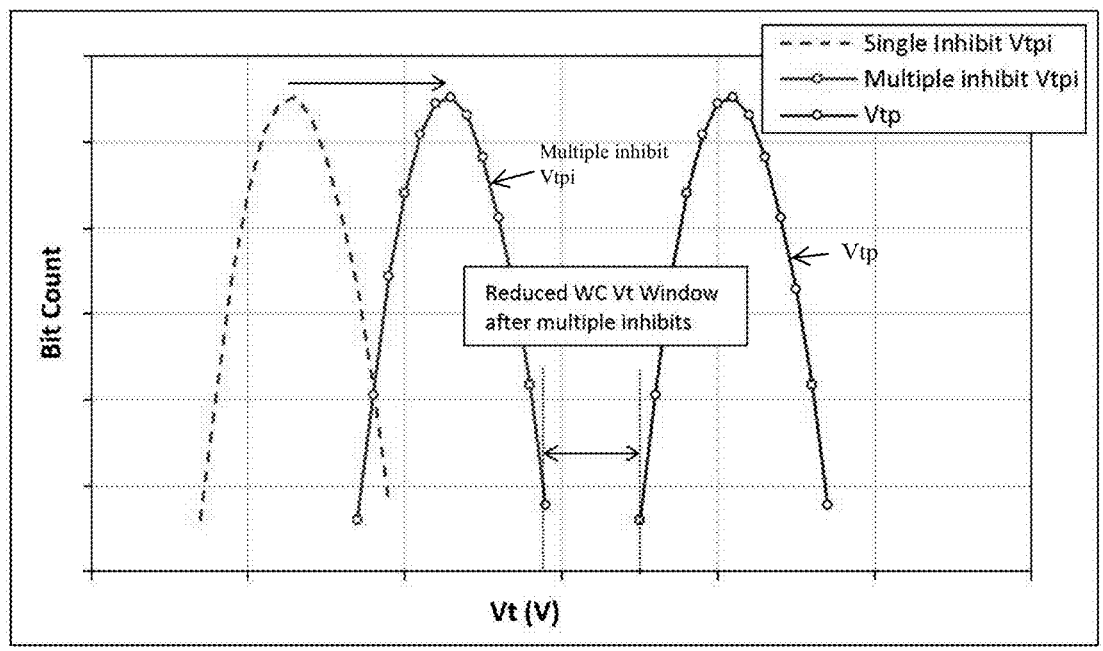
FIG. 7 is a graph illustrating distribution of threshold voltages Vtp, Vtpi (single inhibit), and Vtpi (multiple inhibits) of a memory transistor in a non-volatile memory array according to an embodiment of the present disclosure.

Therefore, in one write cycle, some NVM cells in the selected page, such as those in the $n^{th}$ portion, may be subjected up to n times of inhibit disturbs without a single erase operation. In one embodiment, some NVM cells may be subjected to a total program signal pulse duration of (2×n) ms, if each program operation lasts 2 ms. Referring to FIGS. 4 and 7, Vtpi of NVM cells moves positively (or towards Vtp) as the pulse duration increases. As a result, the worst case Vt window, as depicted in FIG. 7, will be further reduced, which may adversely affect the accuracy of read operations.

Referring to FIG. 3B and Table II, T2 is selected to be inhibited such that the binary state "0" is retained. In one embodiment, both the CG and drain of the memory transistor of T2 are coupled to a positive voltage, $V_{POS}$ and $V_{INHIB}$ respectively. Since the memory transistor is in an erased state (channel opened), $V_{INHIB}$ may be transferred to the channel. As a result, the tunneling field across the ONO stack of the memory transistor may be reduced. In one embodiment, if $V_{POS}$ is kept approximately constant, a more positive (or greater in magnitude) $V_{INHIB}$ applied at the drain (via BL1) of T2 may lead to a reduced inhibit disturb (shift of Vtpi towards Vtp) of memory transistor in NVM cells that are selected to be inhibited (e.g. T2).

Figure 8:
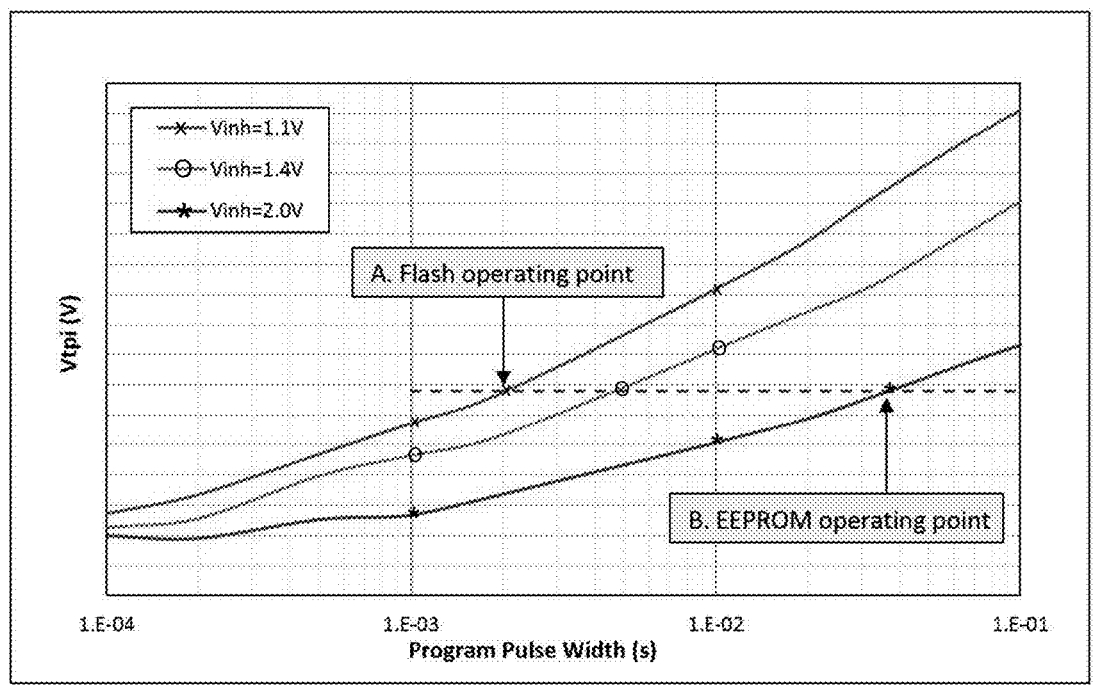
FIG. 8 is a graph illustrating a relationship between inhibit threshold voltage Vtpi and program pulse width during a flash operation mode and an EEPROM operation mode of a memory transistor in a non-volatile memory array according to an embodiment of the present disclosure.

FIG. 8 is a graph illustrating a relationship between inhibit threshold voltage Vtpi and program pulse width during a flash operation mode and an EEPROM operation mode. Referring to FIG. 8, positive shift of Vtpi (inhibit disturb) increases as the program pulse width (time) increases. The issue may be more pronounced in EEPROM operation mode, such as the word/bype programming as depicted in FIG. 6 due to the potential multiple inhibit operations within a single write cycle (hence longer program pulse width) without an erase operation in between. In one embodiment, the rate of increase of Vtpi of the memory transistor is reduced when $V_{INHIB}$ applied to the drain of the NVM cell increases. Using the operation signal voltages in Table II as an example, when $V_{POS}$ is in an approximate range of 5.5 V, if the $V_{INHIB}$ is increased from 1.1 V to an approximate range of 1.5 V-2.5 V, the effect of inhibit disturb on the memory transistors may be reduced in both the EEPROM operation mode and the flash operation mode.

FIG. 9 is a block diagram illustrating a cross-sectional side view of one embodiment of a NVM transistor pair in a non-volatile memory array, such as NVM pair 200 in FIG. 2 or T1 and T2 in FIG. 3B. In one embodiment, as an example, T1 is selected to be programmed and T2 inhibited. When the memory transistor is inhibited, $V_{INHIB}$ is transferred to channel of the memory transistor and the internal node between the memory transistor and the select transistor. As previously explained, a greater $V_{INHIB}$ (e.g. 1.5-2.5 V) may help reduce the inhibit disturb.

Figure 10:
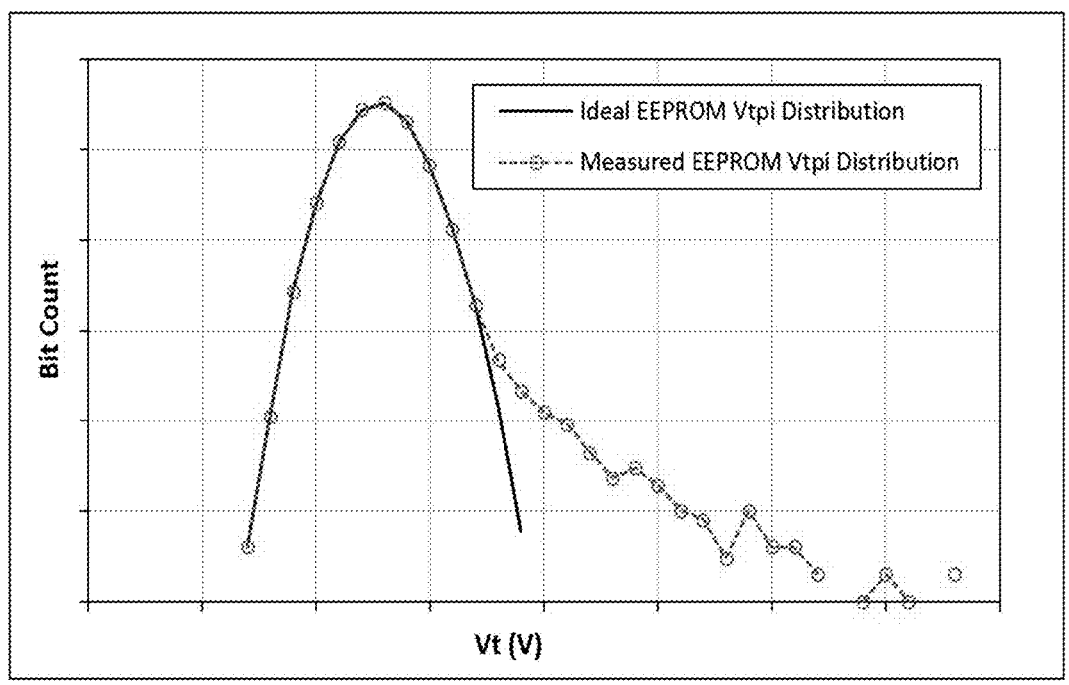
FIG. 10 is a graph illustrating distribution of threshold voltages Vtpi of a memory transistor in a non-volatile memory array operating as EEPROM according to another embodiment of the present disclosure.

As best shown in FIG. 9, when T2 is inhibited, $V_{INHIB}$ is transferred to the channel of the memory transistor and internal node 902. In one embodiment, internal node 902 is doped in a similar manner as the source/drain regions of the NVM cell. Therefore, the increased $V_{INHIB}$ (e.g. 1.5 V or above) applied via the bit line BL1, which helps enable byte/word programming in the EEPROM operation mode, may also adversely increase the internal electric fields under SG of T2 which may in turn increase gate-induced drain leakage (GIDL) current at or around internal node 902 of T2 (Event—1 in FIG. 9). In turn, the GIDL current may become a feed for avalanche multiplication (Event—2 in FIG. 9) at or around the bottom of internal node 902. The generated secondary electrons may then get accelerated by the vertical field under the CG of the memory transistor and trapped in the charge-trapping layer 92 of ONO stack (Event—3 in FIG. 9). As a result, there may be unintentional partial or soft programming of the memory transistor during the inhibit operation. In one embodiment, this phenomenon of unintentional positive shift in Vtpi may cancel or override the reduction in inhibit disturb by adopting a higher $V_{IHBIT}$ in some of the inhibit NVM cells. This mechanism of secondary impact ionization hot electron (SIIHE) soft programming of some NVM cells (previously erased or inhibited) may give rise to a tail in the Vtpi distribution, as best illustrated in FIG. 10.

As discussed previously, adopting a higher $V_{INHIB}$, in particular when a charge-trapping SONOS based NVM array is configured to perform in an EEPROM operation mode, may be useful in reducing the inhibit disturb due to multiple inhibit operations without a single erase. However, the unintentional soft programming as described in FIGS. 9 and 10 needs to be addressed. In one embodiment, optimized doping and implant conditions may be performed to reduce the GIDL current at or around internal node 902 and the internal electric fields that lead to Vtpi tailing behavior at elevated $V_{INHIB}$ voltages (as depicted in FIG. 10).

Figure 11:
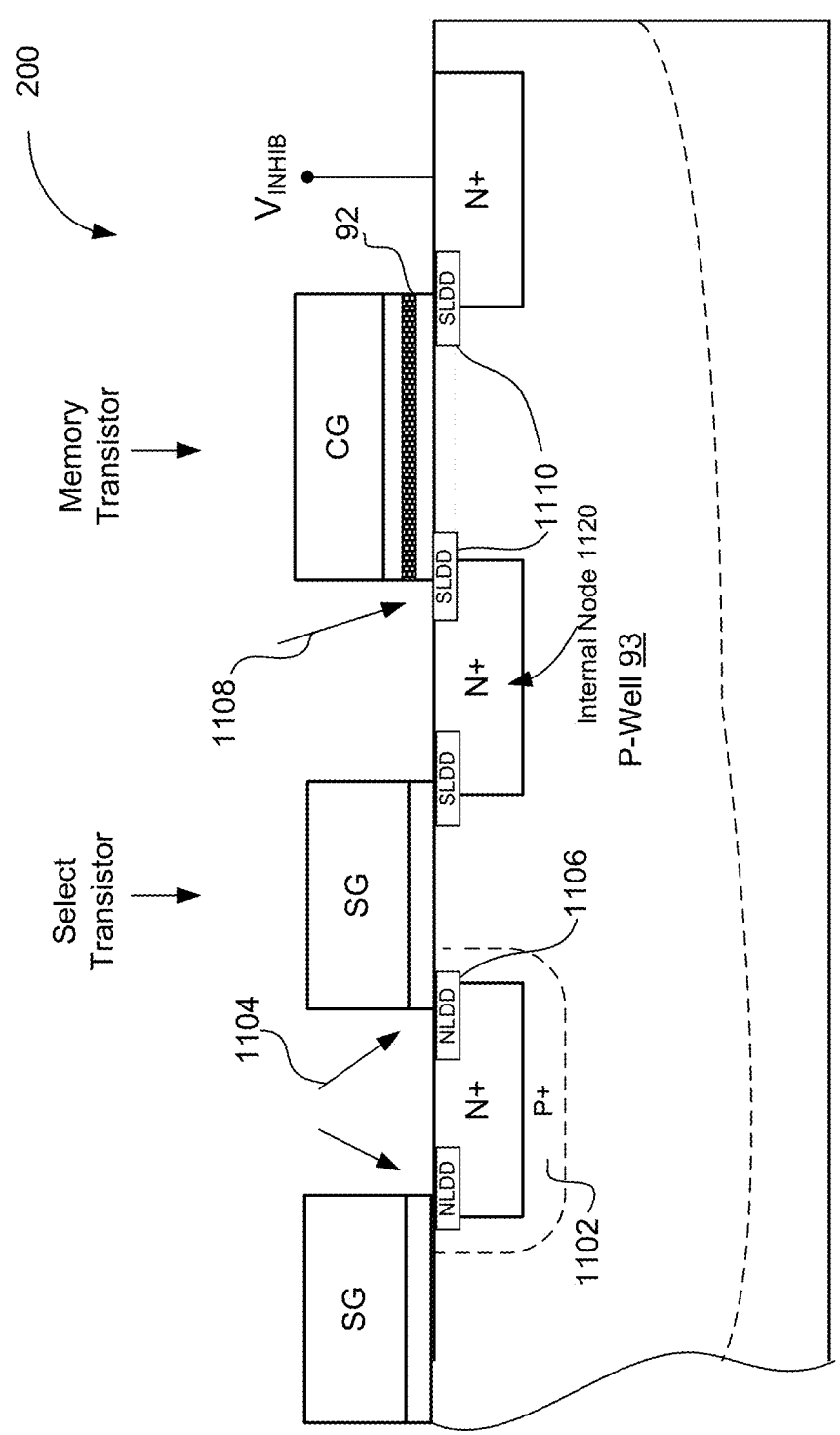
FIG. 11 is a block diagram illustrating a cross-sectional side view of a portion of one embodiment of a non-volatile memory transistor pair according to an embodiment of the present disclosure.

FIG. 11 is a block diagram illustrating a cross-sectional side view of a portion of an NVM pair 200 during an embodiment of fabrication. It will be the understanding that the following doping schemes may be applicable or executed to other NVM cells in the NVM array, such as NVM array 100. In one embodiment, select transistor of NVM cell may be an asymmetric transistor, wherein its source and drain may have different doping schemes. As discussed previously, two adjacent NVM cells share a source region disposed between the two select transistors. In one embodiment, the shared source region may form a part of or coupled to the CSL. As best shown in FIG. 11, a lightly doped drain region (NLDD) 1106 is formed at or around the shared source region. In one embodiment, NLDD 1106 may be formed by implanting n-type ions into the shared source region. The NLDD 1106 implant formation may be part of a baseline fabrication process and use a mask (not shown) or spacers (not shown) as part of the implantation process. Subsequently, the mask of the NLDD implant may be used to form a halo implant 1102 around the shared source region of the select transistor, without forming halo implants in other regions, such as the drain region of the select transistor (internal node 1120). The halo implant 1102 may be high-tilt halo implants that are performed at an angle (see doping material 1104) so the halo implant 1102 is formed at least partially under SG. Halo implant 1102 may encapsulate at least partly the previously formed NLDD 1106 and the shared source region of the select transistor, and be a p-type material 1104. The halo implant 1102 may only be formed in the source region of the select transistor, making it an asymmetric select transistor.

In one embodiment, asymmetric halo implant of the select transistor, such as halo implant 1102, may increase SG threshold voltage and manage short-channel effects. As a result, the reduced SG channel leakage may help curb the occurrence or degree of GIDL current (Event—1 in FIG. 9), which will contribute charge carriers that get injected into ONO stack of the memory transistor (unintentional soft programming or inhibit disturb) due to possible elevated $V_{INHIB}$.

In another embodiment, inhibit disturb may be reduced by controlling the dose, energy and/or implant angle of SONOS LDD implant (SLDD) 1110 at or around the source and drain regions of the memory transistor and/or drain region of select transistor. In one embodiment, select transistor may have NLDD 1106 on its source side and SLDD 1110 on its drain side. In one embodiment, SLDD 1110 may be formed by angled implant of n-type material 1108, such that SLDD 110 may be disposed at least partly under the ONO and CG stack of the memory transistor. In one embodiment, SLDD 1110 implant is formed using low implant dose in an approximate range of 1e12-1e14 atoms per cm$^2$, a high energy in an approximate range of 2 keV-20 keV, and a tilt angle in an approximate range of 0 to 30 degree. In one embodiment, the lower dose and higher energy SLDD 1110 at the internal node and drain of the memory transistor may help reduce SG GIDL current which is a feed current for possible SIIHE. Besides, the SLDD 1110 may cause Vtp of the memory transistor to be more positive and Vtpi more negative, contributing to a larger worst case (Vtp-Vtpi) window. The lower dose and high energy SLDD 1110 may also increase SG threshold voltage, thus reducing the channel leakage current.

In one embodiment, inhibit disturb of the memory transistor may also be reduced by a light p-well 93 implant, in an approximate range of 1e12-1e14 atoms per cm' (p-type). The lighter p-well 93 doping scheme may help reduce SG threshold voltage. Additionally, a graded junction at or around the interface of p-well 93 and source region of memory transistor (internal node 1120) may help reduce SIIHE generation at elevated $V_{INHIB}$, such as in the range of 1.5 V-2.5 V. For example, p-well 93 may be doped with boron or other p-type dopants in an approximate range of 1e12-1e14 atoms per cm$^2$. In one embodiment, a different dose e.g. lower dose of dopant (less than 1e12-1e14 atoms per cm$^2$) and/or with varying energy at or around the interface between p-well 93 and source region (internal node 1120) of the memory transistor may create a graded junction, hence making the less drastic transition from p-well 93 (p-type doping) to internal node 1120 (n-type doping).

Inhibit disturb of the memory transistor may also be strongly dependent on the nature of charge traps in charge-trapping layer 92 of the ONO stack. In one embodiment, as best shown in FIG. 1A, charge-trapping layer 92 may include silicon oxynitride ($Si_xO_yN_z$). Inhibit disturb may be reduced by minimizing the number of shallow charge traps by reducing the silicon content and/or increasing the oxygen content of the charge-trapping layer 92. In one embodiment, the silicon content may be controlled in an approximate range of 40%-60% and oxygen content in an approximate range of 10%-40%.

Figure 12:
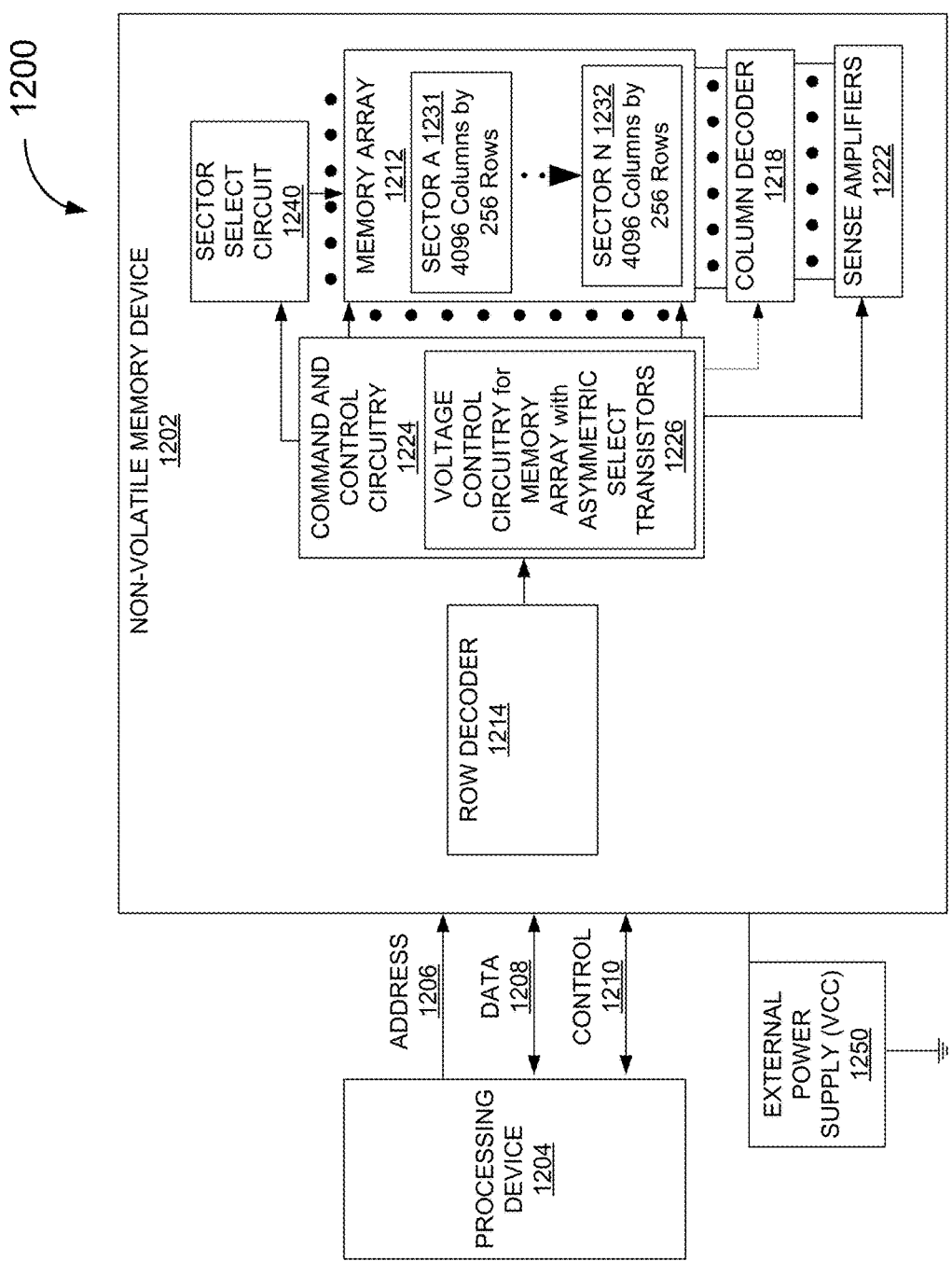
FIG. 12 is a schematic diagram illustrating an embedded NVM system including both flash memory and EEPROM memory in accordance with one embodiment of the subject matter.

FIG. 12 is a schematic diagram illustrating an embedded NVM system including both flash memory and EEPROM memory in accordance with one embodiment of the subject matter. FIG. 12 is a block diagram illustrating an embedded NVM system, according to an embodiment. NVM system 1200 may include a processing device 1204 coupled to NVM device 1202 via address bus 1206, data bus 1208, and control bus 1210. It will be appreciated by those skilled in the art that NVM system 1200 has been simplified for the purpose of illustration, and not intended to be a complete description. In particular, details of the processing device 1204, row decoder 1214, column decoder 1218, sense amplifiers 1222, and command and control circuitry 1224, are not described in detail herein. It should be appreciated that NVM system 1200 may include all, some, or more components than the embodiment in FIG. 12. In one exemplary embodiment, processing device 1204 may be the Programmable System on a Chip (PSoC®) processing device, developed by Cypress Semiconductor Corporation, San Jose, Calif. Alternatively, processing device 1204 may be one or more other processing devices known by those of ordinary skill in the art, such as a microprocessor or central processing unit ("CPU"), a controller, special-purpose processor, digital signal processor ("DSP"), an application specific integrated circuit ("ASIC"), a field programmable gate array ("FPGA"), or the like.

NVM device 1202 includes memory array 1212, similar to NVM array 200 of FIG. 2, organized as rows and columns of non-volatile memory cells (not shown in FIG. 12) as described below. In one embodiment, as discussed in greater detail previously, NVM device 1202 may include various memory cells (not shown) configured to store data values. The memory cells may be implemented with a 2T architecture and common source line to reduce the overall footprint of each memory cell. Each memory cell may also be charge-trapping SONOS based and compatible with Fowler-Nordheim programming techniques. Memory array 1212 may include one or more NVM sectors, such as sector A 1231 though sector N 1232. In one embodiment, a portion of sectors, for example sector A-E may be configured to function as flash memory, and another portion of sectors, e.g. sectorF-N may be configured to function as EEPROM memory. As discussed earlier, memory cells of both flash memory and EEPROM memory are structurally alike, charge-trapping SONOS based, and disposed within one single integrated circuit package or semiconductor die.

In one embodiment, command and control circuitry 1224, including voltage control circuitry 1226, may be programmable and configured to provide various operation voltage signals to memory array 1212 via SONOS word lines, word lines, bit lines, etc., including and not limited to $V_{POS}$, $V_{NEG}$, $V_{CSL}$, $V_{MARG}$, $V_{INHIB}$, as depicted in FIGS. 3A and 3B. In one embodiment, command and control circuitry 1224 may include a selection circuitry to select whether to write data structures to flash memory or EEPROM memory with the same memory array 1212, depending on the nature of data structures. Data structures with longer bit length or less frequently updated such as codes will be stored in flash memory, such as sector A-E, and data structures with shorter bit length or frequently updated such as Bluetooth pairing information will be selected to be stored in EEPROM memory, such as sectorF-N.

Thus, embodiments of a non-volatile memory and methods of operating the same to reduce inhibit disturbs in both flash and EEPROM memory have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A memory device, comprising:
a non-volatile memory (NVM) array, divided into a flash memory portion and an electrically erasable programmable read-only memory (EEPROM) portion, including charge-trapping memory cells arranged in rows and columns, wherein each memory cell includes:
a memory transistor including an angled lightly doped drain (LDD) implant in source and drain regions, wherein the angled LDD implant extends at least partly under an oxide-nitride-oxide (ONO) stack of the memory transistor, and
a select transistor including a shared source region with a halo implant, wherein the shared source region is shared between two adjacent memory cells of a same row of the NVM array,
wherein the flash memory portion and the EEPROM portion are disposed within one single semiconductor die.

2. The memory device of claim 1, wherein the memory cells have a two-transistor (2T) architecture.

3. The memory device of claim 1, wherein the memory transistor is silicon-oxide-nitride-oxide-silicon (SONOS) based, each including a charge-trapping oxynitride layer.

4. The memory device of claim 3, wherein the charge-trapping oxynitride layer has silicon content in an approximate range of 40-60% and oxygen content in an approximate range of 10-40%.

5. The memory device of claim 1, wherein the halo implant surrounds at least partly the shared source region of the two adjacent memory cells.

6. The memory device of claim 1, wherein the select transistor is an asymmetric transistor, wherein a drain region of the select transistor does not include the halo implant.

7. The memory device of claim 1, wherein the angled LDD implant of the memory transistor comprises dopant dose in an approximate range of 1e12-1e14 atoms per $cm^2$.

8. The memory device of claim 1, wherein the memory cells comprise n-type transistors, and disposed at least partly within a p-type well, and wherein the p-type well comprises dopant dose in an approximate range of 1e12-1e14 atoms per $cm^2$.

9. The memory device of claim 8, wherein the p-type well is doped with boron atoms around a junction with the source region of the memory transistor for a graded junction.

10. The memory device of claim 1, wherein the shared source region of the select transistor includes a first LDD, wherein the first LDD and the halo implant are implanted with dopants of opposite types.

11. The memory device of claim 1, wherein the EEPROM portion of the memory device is configured to perform word programming, wherein multiple words are written to one selected row of the EEPROM portion of the NVM array sequentially using multiple program operations, and wherein no erase operation is performed between each of the multiple program operations.

12. A memory array, comprising:
an electrically erasable programmable read-only memory (EEPROM) portion, comprising memory cells arranged in rows and columns, wherein,
in the EEPROM portion, each memory cell includes a charge-trapping non-volatile memory (NVM) transistor, wherein memory cells in a same row share a silicon-oxide-nitride-oxide-silicon SONOS word line, memory cells in a same column share a bit line, and memory cells in two adjacent columns couple to a common source line, and
during word programming of a selected row of the EEPROM portion, multiple words are written to memory cells of the selected row sequentially using multiple program operations, wherein no erase operation is performed between each of the multiple program operations, and
during programming of a first word to a first portion of the selected row, a positive voltage is applied to a SONOS word line associated with the selected row, a high inhibit voltage in an approximate range of 1.5 V-2.5 V is applied to bit lines associated with memory cells of the first portion wherein an erased state is to be written, and the high inhibit voltage is further applied to bit lines associated with memory cells in portions of the selected row other than the first portion.

13. The memory array of claim 12, wherein:
during programming of a second word to a second portion of the selected row, the high inhibit voltage is applied to bit lines associated with memory cells of the second portion wherein the erased state is to be written, and memory cells in portions of the selected row other than the first and second portions.

14. The memory array of claim 13, wherein the first and second portions do not overlap.

15. The memory array of claim 12, further comprising a flash memory portion, wherein the flash memory portion and the EEPROM portion are disposed within one single semiconductor die.

16. The memory array of claim 12, wherein each of the memory cells of the EEPROM portion further includes an asymmetric select transistor, and wherein the source of the asymmetric select transistor includes a halo implant.

17. An embedded system, comprising:
   a non-volatile memory (NVM) array divided into a flash portion and an electrically erasable programmable read-only memory (EEPROM) portion, wherein each of the flash and EEPROM portions include charge-trapping memory cells arranged in rows and columns, wherein each memory cell includes:
      a silicon-oxide-nitride-oxide-silicon (SONOS) based memory transistor including an angled lightly doped drain (LDD) implant in source and drain regions, wherein the drain region is coupled to a bit line and a control gate is coupled to a SONOS word line, and
      a select transistor including a shared source region with a halo implant, wherein the shared source region is shared between two adjacent memory cells of a same row of the NVM array; and
   a programmable control circuitry coupled to the EEPROM portion, configured to provide operating voltages to enable word programming of a selected row of the EEPROM portion.

18. The embedded system of claim 17, wherein the angled LDD implant of the memory transistor comprises dopant dose in an approximate range of 1e12-1e14 atoms per $cm^2$.

19. The embedded system of claim 17, wherein the word programming includes writing multiple words sequentially to the selected row using multiple program operations, wherein no erase operation is performed between each of the multiple program operations.

20. The embedded system of claim 19, wherein the operating voltages include:
   a first high voltage provided to a SONOS word line associated with memory cells of the selected row; and
   a second high voltage provided to bit lines associated with memory cells to be inhibited, wherein the second high voltage is an inhibit voltage in an approximate range of 1.5 V-2.5 V to reduce inhibit disturb.

* * * * *